United States Patent [19]
Duncan et al.

[11] Patent Number: 6,081,412
[45] Date of Patent: Jun. 27, 2000

[54] GATE OXIDE BREAKDOWN PROTECTION CIRCUIT FOR DEEP SUBMICRON PROCESSES

[75] Inventors: Richard L. Duncan, Bedford; Joseph D. Wert, Arlington, both of Tex.

[73] Assignee: National Semiconductor Corporation, Santa Clara, Calif.

[21] Appl. No.: 09/119,706

[22] Filed: Jul. 20, 1998

[51] Int. Cl.$^7$ ...................................................... H02H 3/00
[52] U.S. Cl. .............................. 361/86; 361/56; 361/100; 361/111
[58] Field of Search .............................. 361/56, 111, 113, 361/115, 91.1, 100, 119, 18, 86

[56] References Cited

U.S. PATENT DOCUMENTS 5,555,149  9/1996  Wert et al. .................................. 361/18

*Primary Examiner*—Stephen W. Jackson
*Attorney, Agent, or Firm*—Skjerven, Morrill, MacPherson, Franklin & Friel LLP

[57] ABSTRACT

An output driver prevents gate oxide breakdown and reverse charge leakage from a bus to the internal power supply. When the voltage on the bus exceeds the internal supply voltage or when the driver is powered down, a reference voltage generator provides intermediate voltages to prevent the development of excessive gate-source, gate-drain, and gate-backgate voltages in the driver. An upper protection circuit and a lower protection circuit multiplex the intermediate voltages to ensure driver protection and proper operation. A buffering circuit turns off a buffering transistor to block charge leakage to the internal power supply when the bus voltage is greater than the internal power supply voltage. A logic protection circuit prevents the bus voltage from appearing at the control terminal of the driver.

11 Claims, 1 Drawing Sheet

GATE OXIDE BREAKDOWN PROTECTION CIRCUIT FOR DEEP SUBMICRON PROCESSES

BACKGROUND OF THE INVENTION

1. Field of the Invention

The present invention relates to overvoltage protection, and in particular, to an output driver to prevent reverse charge leakage and gate oxide breakdown when the voltage on the driver output exceeds the driver internal power supply voltage or when the driver is powered down.

2. Discussion of the Related Art

Many modern systems combine modules accepting different voltage levels. For example, in a laptop computer, processor modules powered by a 3.3 V voltage are combined with disk drives powered by a 5.0 V voltage. This difference in operating conditions can cause problems for the module using the lower power supply voltage. The condition of reverse charge leakage occurs when a module applies a voltage to a common bus that forces open a charge leakage path from the bus to the power supply of a module operating at a lower power supply voltage. For instance, a 3.3 V module using a PMOS pullup transistor at its output to a bus applies a 3.3 V gate voltage to turn off the PMOS transistor. However, if the bus is raised to 5.0 V by a commonly connected 5.0 V module, the PMOS transistor will be turned on, providing a conductive path from the bus to the 3.3 V power supply. Since the backgate of the 3.3 V PMOS transistor is typically tied to 3.3 V as well, the drain/backgate diode of the device provides another conductive channel. Another problem that occurs with modules operating under different power supply voltages is the potential for gate oxide breakdown when the lower-power module is powered down (i.e. power supply voltage is at 0 V). For instance, in a 3.3 V process, the maximum voltage allowed from the gate to the source, drain, in any device is 4.6 V. The maximum gate to backgate voltage is 5.3 V. A 5.0 V signal appearing on a common bus when the 3.3 V module is powered down can create gate oxide voltages exceeding the 4.6 V level, leading to device failure. In U.S. Pat. No. 5,555,149, issued Sep. 10, 1996 to Wert et al., an output buffer is presented that prevents reverse charge leakage by using isolation transistors to block potential leakage paths. However, when the invention of Wert et al. is powered down, it provides no protection against gate oxide breakdown.

Accordingly, it is desirable to provide an output protection circuit that avoids reverse charge leakage while preventing excessive gate oxide voltage development when powered down.

SUMMARY OF THE INVENTION

The present invention provides an output driver that prevents reverse charge leakage to its power supply from a common bus shared with a higher-voltage module, and also ensures that voltages generated across its device gate oxides never exceed a specified breakdown voltage, even when the driver is powered down. An embodiment of the present invention includes output driver transistors to provide an output signal at an output terminal, buffering circuits to limit the voltage seen by output driver transistors in the circuit due to external voltages on the output terminal, and a reference voltage generator to provide buffer voltages to the circuit when powered down in order to prevent the specified breakdown voltage from appearing in the circuit. In an implementation of the resent invention, the buffering circuits include buffering transistors in series between the output driver transistors and the output terminal, and the reference voltage generator includes a diode string in series with the output terminal to provide the reduced interim voltages from the external voltage. An embodiment of the present invention also includes protection circuits to apply the interim voltages to the driving and buffering transistors in order to keep the gate oxide voltages below the specified breakdown voltage. Another embodiment of the present invention includes a logic protection circuit to prevent the external voltage from being sent to a control logic circuit controlling the output driver.

The present invention will be better understood upon consideration of the accompanying drawings and the detailed description below.

BRIEF DESCRIPTION OF THE DRAWINGS

The FIGURE shows a block diagram of the present invention.

DETAILED DESCRIPTION

Figure 1:
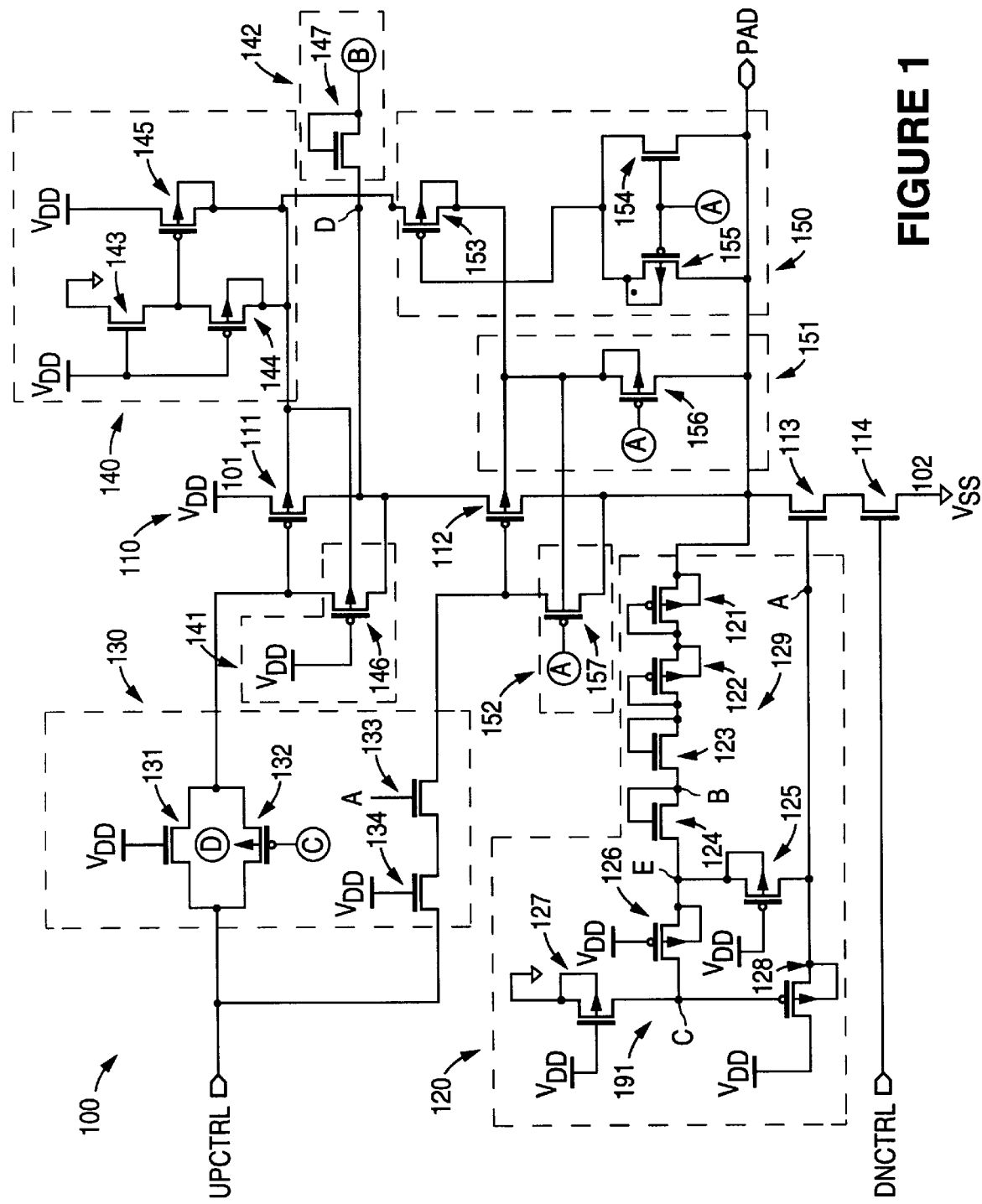

An embodiment of the present invention is shown in the FIGURE, which depicts a diagram of an output driver 100 for a 2.5 V process that protects against a 3.3 V signal. Slight modifications can allow the circuit to be used with other voltage combinations as well. In the FIGURE, an internal power supply voltage VDD equal to 2.5 V powers driver 100. A lower supply voltage VSS is at GROUND potential (i.e. 0 V), although a non-ground reference voltage could just as well be incorporated. Control signals from a control logic circuit (not shown) are applied to input terminals UPCTRL and DNCTRL to control the output of driver 100 at an output terminal PAD. During normal operation, driver 100 provides either voltage VDD or 0 V at terminal PAD. When terminals UPCTRL and DNCTRL are both at GROUND, terminal PAD is raised to voltage VDD. When terminals UPCTRL and DNCTRL are both at voltage VDD, terminal PAD is pulled to GROUND. During tri-state operation, terminal UPCTRL is at voltage VDD and terminal DNCTRL is at GROUND, forcing the output of driver 100 into an open state.

Terminal PAD is connected to a bus (not shown) that is connected to at least one other module (not shown) that can drive the bus with an external voltage VDDEX that is higher than voltage VDD. In the embodiment shown, at least one other module can drive the bus with 3.3 V, leading to an overload state of operation. To prevent damage during this overload state, the power supply of driver 100 is shielded from reverse charge leakage and the devices of driver 100 are protected from excessive gate oxide voltage.

A reference voltage generator circuit 120 enables driver 100 to maintain all voltages across gate oxides below a specified breakdown voltage Vbd by providing reference voltages that vary according to the state of the system. An example of circuit 120 shown in the FIGURE includes a diode string 129 and an output control circuit 191 to provide the appropriate reference voltages. Diode string 129 includes PMOS transistors 121 and 122, and NMOS transistor 123 and 124. Each of transistors 121, 122, 123 and 124 has coupled gates and sources, while both transistors 121 and 122 have their backgates coupled with their drains. The backgates of transistors 123 and 124, and all other NMOS transistors shown in the FIGURE are connected to lower supply terminal 102. The drain of transistor 121 is connected to terminal PAD, the drain of transistor 122 is connected to the source of transistor 121, the source of transistor 123 is connected to the source of transistor 122, and the source of transistor 124 is connected to the drain of transistor 123. Output control circuit 191 includes PMOS transistors 125, 126, and 128, and a NMOS transistor 127. Each transistor in circuit 191 is backgate-source coupled, and the gates of transistors 125, 126, and 127 are connected to an upper supply terminal 101. The drain of transistor 128 is connected to upper supply terminal 101, and its source is connected to the gate of transistor 113 and the drain of transistor 125 at a node A. The source of transistor 125 is connected to the drain of transistor 124 and the source of transistor 126. The drain of transistor 126 is connected to the gate of transistor 128 and the drain of transistor 127 at a node C. Finally, the source of transistor 127 is connected to a lower supply terminal 102.

An output stage 110 provides the output of driver 100 to output terminal PAD. The source of a PMOS upper driver transistor 111 is connected to upper supply terminal 101 which receives voltage VDD. The drain of transistor 111 is connected to the source of a PMOS upper buffer transistor 112 in a cascode configuration. The drain of transistor 112 is connected to terminal PAD. The source of a NMOS lower driver transistor 114 is connected to lower supply terminal 102 which is connected to GROUND. The gate of transistor 114 is connected to terminal DNCTRL, while its drain is coupled to the source of a NMOS lower buffer transistor 113 in a cascode configuration. The drain of transistor 113 is connected to terminal PAD.

The gates of transistors 111 and 112 are connected to terminal UPCTRL through a logic protection circuit 130. Circuit 130 prevents external voltage VDDEX at output terminal PAD from appearing at input terminal UPCTRL, where it could cause damage to the controlling logic for driver 100. In the implementation shown in the FIGURE, circuit 130 includes a transmission gate made up of a NMOS transistor 131 and a PMOS transistor 132 connected in parallel between terminal UPCTRL and the gate of transistor 111. The gate of transistor 132 is tied to node C of circuit 120, while its backgate is connected to node D of the backgate protection circuit 140. The gate of transistor 131 is tied to upper supply terminal 101. Circuit 130 also includes a NMOS logic buffering transistor 133 and a NMOS blocking transistor 134 connected in series between the gate of transistor 112 and terminal UPCTRL. The source of transistor 133 is tied to the gate of transistor 112 and the source of transistor 134 is tied to the drain of transistor 133. Upper supply terminal 101 drives the gate of transistor 134, while the gate of transistor 133 is tied to node A of circuit 120.

Driver 100 includes circuitry to ensure that transistor 111 behaves properly during normal operation and does not provide a charge leakage path to upper supply terminal 101 when voltage VDDEX appears at output terminal PAD. This protective function is performed by a driver bypass circuit 141, a driver backgate control circuit 140, and a driver backgate protection circuit 142. While power supply voltage VDD is applied to upper supply terminal 101, circuit 140 provides a conductive path from the backgate of transistor 111 to terminal 101. When voltage VDD is removed from terminal 101 and voltage VDDEX is present on output terminal PAD, circuit 140 suppresses the path between the backgate of transistor 111 and terminal 101, and circuit 142 provides a buffer voltage Vbuf to the drain of transistor 111. A reduced version of the buffer voltage, Vbuf, is also transferred to the backgate of transistor 111 through the P+/N− diode of the PMOS transistor. At the same time, circuit 141 transfers the voltage at the drain of transistor 111 to its gate in order to turn off transistor 111 and prevent breakdown voltage buildup across its gate oxide. In the implementation depicted in the FIGURE, circuit 141 includes a PMOS transistor 146 having its source connected to the gate of transistor 111 and its drain connected to the drain of transistor 111. The backgate of transistor 146 is connected to node D of the backgate protection circuit 140. The gate of transistor 146 is connected to upper supply terminal 101. Circuit 140 includes an NMOS transistor 143 and a backgate-drain coupled PMOS transistor 144 serially connected in an inverting configuration. The source of transistor 143 is tied to lower supply terminal 102, the drain of transistor 144 is connected to the backgate of transistor 111, and the gates of both transistor 143 and 144 are coupled to upper supply terminal 101. The gate of backgate-drain coupled PMOS transistor 145 is driven by the output of transistors 143 and 144. The source of transistor 145 is connected to upper supply terminal 101 and its drain is tied to the backgate of transistor 111. Finally, the implementation of circuit 142 shown in the FIGURE includes a gate-source coupled NMOS transistor having its source tied to node B of circuit 120 and its drain connected to the drain of transistor 111.

The transistor 112 must open and close a conductive path from upper supply terminal 101 to output terminal PAD during normal operation, and shield transistor 111 from excessive voltage when overload voltage VDDEX appears at terminal PAD. This functionality is provided by a buffer bypass circuit 152, a buffer backgate control circuit 150, and a buffer backgate protection circuit 151. In the implementation shown in the FIGURE, circuit 150 includes a backgate-drain coupled PMOS transistor 153 connected between the backgate of transistor 111 and the backgate of transistor 112. The gate of transistor 153 is driven by either a NMOS transistor 154 or a backgate-source coupled PMOS transistor 155, both of which are connected in parallel between the gate of transistor 153 and output terminal PAD. The gates of both transistor 154 and 155 are tied to node A of circuit 120. Circuit 151 is shown as a backgate-source coupled PMOS transistor 156 having its drain connected to output terminal PAD and its source tied to the backgate of transistor 112. The gate of transistor 156 is connected to node A of circuit 120. Lastly, an embodiment of circuit 152 includes a PMOS transistor 157 coupled between the gate and drain of transistor 112. The gate of transistor 157 is tied to node A of circuit 120, while its backgate is connected to the backgate of transistor 112.

The intermediate voltages provided by circuit 120 are used by driver 100 to either present normal operating voltages to the gates, sources and drains of the transistors in the circuit or prevent the exceeding of the gate oxide breakdown voltage Vbd. Transistors 121, 122, 123, and 124 are configured to behave as diodes, lowering the voltage at terminal PAD in specific increments. A voltage Vb at node B is given by the formula:

Vb=Vpad−2*Vtp−Vtn where Vpad is the voltage at terminal PAD, Vtp is the threshold voltage of a PMOS transistor, and Vtn is the threshold voltage of a NMOS transistor. In some embodiments, voltage Vtp=0.9 V and voltage Vtn=0.7 V. Similarly, a voltage Ve at node E is given by:

Ve=Vpad−2*Vtp−2*Vtn

Vbuf is the voltage at node E when voltage VDDEX is present at terminal PAD, and is therefore defined as:

Vbuf=VDDEX−2*Vtp−2*Vtn

While the driver is on and terminal 101 is at voltage VDD, transistor 127 is fully on, pulling node C to voltage VSS, which is equal to 0 V in the example shown. This turns on transistor 128, which then provides voltage VDD to node A, turning on transistor 113 and providing transistor 114 with full control over the lower cascode pair of output stage 110. However, when power is removed from terminal 101, transistor 127 is turned off, and transistor 126 is turned on, providing voltage Ve to node C. Transistor 125 also turns on, switching node A to voltage Ve. When voltage VDDEX is present at terminal PAD, voltage Ve, and hence the voltage at the gate of transistor 113, equals voltage Vbuf, which prevents the voltage across the gate oxide of transistor 113 from exceeding breakdown voltage Vbd.

The voltage at terminal UPCTRL is fed to output stage 110 through circuit 130. During normal operation, because node C of circuit 120 is at 0 V, the transmission gate formed by transistors 131 and 132 provides full range transmission of the voltage at terminal UPCTRL. Since node A of circuit 120 is at voltage VDD, both transistors 133 and 134 are fully on. Therefore, when terminal UPCTRL is at 0 V, both transistors 111 and 112 are fully on, providing voltage VDD to output terminal PAD. When terminal UPCTRL is at voltage VDD, transistor 111 is completely off, isolating terminal PAD from upper supply terminal 101. In order to prevent failure due to overvoltage, the upper cascode pair of output stage 110 utilizes the voltages provided by circuit 120. During normal operation, the backgates of transistors 111 and 112 are held at voltage VDD by circuits 140 and 150, respectively. In circuit 140, voltage VDD turns on transistor 143, which provides a 0 V signal to turn on transistor 145. Transistor 145 then applies voltage VDD to the backgate of transistor 111. Circuit 140 ties the backgate of transistor 112 to the backgate of transistor 111 with transistor 153. During normal operation, voltage VDD provided by node A to the gate of transistor 154 keeps transistor 153 on, holding the backgate of transistor 112 at voltage VDD. When driver 100 is tri-stated and voltage VDDEX is applied to output terminal PAD, transistor 112 blocks voltage VDDEX from transistor 111. In circuits 150, 151, and 152, voltage VDDEX at terminal PAD causes transistors 155, 156, and 157 to all turn on since the voltage at node A remains at voltage VDD. Transistor 155 turns off transistor 153 by applying voltage VDDEX to its gate. Since node D is still at voltage VDD, the voltage across the gate oxide of transistor 153 remains below breakdown voltage Vbd. Meanwhile, transistor 156 provides voltage VDDEX to the backgates of transistors 112 and 157. Transistor 157 wraps voltage VDDEX around to the gate of transistor 112, turning off transistor 112 and removing any conduction path between terminal PAD and transistor 111. Voltage Vbuf at node D also prevents gate oxide breakdown in transistor 112. Voltage VDDEX at the gate of transistor 112 is also seen by transistor 133. Since the voltage at node A of circuit 120 is at voltage VDD, transistor 133 lowers the voltage at the source terminal of transistor 134 from VDDEX to VDD−Vtn, thus preventing voltage VDDEX from reaching terminal UPCTRL. Similar protection operation occurs when driver 100 is turned off and voltage VDDEX is present on output terminal PAD. However, in this case, since terminal 101 is no longer at voltage VDD, circuit 140 no longer provides voltage VDD to the backgate of transistor 111. In that case, circuit 142 applies voltage Vbuf to the drain of transistor 111. Voltage is provided to the backgate of transistor 111 through a forward biased P+/N− diode in transistor 111. A diode drop from the drain of transistor 111 to the backgate of transistor 111 results in a voltage Vbuf−Vdiode at the backgate of transistor 111. This has the effect of holding the sources of transistors 153 and 112 at voltage Vbuf to prevent gate oxide breakdown. In addition, transistor 146 wraps the voltage at the drain of transistor 111 to its source, turning it off. Similarly, transistor 157, with its gate at voltage Vbuf, once again wraps voltage VDDEX from output terminal PAD to the gate of transistor 112 to turn off transistor 112. In circuit 130, voltage Vbuf at the gate of transistor 133 causes it to lower voltage VDDEX from transistor 157 before it reaches transistor 134, which is turned completely off. Voltage VDDEX is therefore blocked from terminal UPCTRL while the voltages across the gate oxides of transistors 133 and 134 are kept below breakdown voltage Vbd. Additionally, voltage Vbuf at node C turns off transistor 132 and the removal of voltage VDD turns off transistor 131, preventing any signal leakage across the transmission gate formed by transistors 131 and 132. Finally, in the lower cascode pair of output stage 110, voltage Vbuf from node A turns on transistor 113, lowering voltage VDDEX from transistor 113 before it reaches transistor 114. In this manner, reverse charge leakage and gate oxide breakdown within driver 100 is prevented. Note that in the implementation of the FIGURE, all forward biased P+/N− diodes in the PMOS transistors have been eliminated in order to prevent any leakage path back to upper supply terminal 101 from forming.

While a preferred embodiment of the present invention has been described in detail, other embodiments and variations are within the scope of the invention. In particular, the invention is not limited by transistor sizes or particular transistor connections. For instance, diode string 129 could be implemented with three PMOS transistors, rather than two. Also, the source and drain terminals of many of the described transistors could be reversed while maintaining proper circuit performance. Also, as stated previously, various values of voltages VDD and VDDEX can be accommodated with the present invention. By adjusting the quantity and the characteristics of the devices in diode string 129, intermediate voltage Vbuf can be adjusted to provide proper protection for different voltages VDD and VDDEX.

We claim:

1. An output driver comprising:
   an upper control terminal;
   a lower control terminal;
   an output terminal;
   a upper supply terminal for receiving a power supply voltage;
   a lower supply terminal for receiving a low rail voltage, said low rail voltage being smaller than said power supply voltage;
   an output stage including an upper driver circuit comprising an upper driver transistor and an upper buffering transistor in a cascode configuration, and a lower driver circuit comprising a lower buffering transistor and a lower driver transistor in a cascode configuration, said upper driver circuit being coupled between said upper supply terminal and said output terminal, and said lower driver circuit being coupled between said lower supply terminal and said output terminal; and
   a reference voltage generator circuit for providing a plurality of reference voltages to said output driver in order to prevent gate oxide breakdown when an overload voltage larger than said power supply voltage is present on said output terminal.

2. The driver of claim 1 further comprising:
   a first upper protection circuit for keeping the voltage across the gate oxide of said upper driver transistor below said specified breakdown voltage while maintaining proper functioning of said upper driver circuit; and a second upper protection circuit for keeping the voltage across the gate oxide of said upper buffering transistor less than said specified breakdown voltage while maintaining proper functioning of said upper driver circuit.

3. The driver of claim 2 further comprising a logic protection circuit for allowing the voltage on said upper control terminal to be passed to said upper driver circuit while preventing any voltages on said output terminal from appearing on said upper control terminal.

4. The driver of claim 3 wherein said reference voltage generator circuit further includes:

a voltage reduction circuit for applying a specified voltage drop to the voltage on said output terminal in order to generate a buffer voltage;

an output control circuit for providing a first reference output, a second reference output, and a third reference output to a first reference terminal, a second reference terminal, and a third reference terminal, respectively, wherein:

said first reference output is equal to said power supply voltage when said upper supply terminal is at said power supply voltage, and said buffer voltage when said upper supply terminal is at said lower rail voltage;

said second reference output is equal to said lower rail voltage when said upper supply terminal is at said power supply voltage, and said buffer voltage when said upper supply terminal is at said lower rail voltage; and said third reference output is equal to an intermediate buffer voltage, said intermediate buffer voltage being larger than said buffer voltage by a second specified voltage.

5. The driver of claim 4 wherein said voltage reduction circuit comprises:

a diode string including a plurality of voltage drop devices serially connected to said output terminal; and said output control circuit comprises:

a first gating transistor coupled between said upper supply terminal and said first reference terminal, having its gate couple to said second reference terminal;

a second gating transistor coupled between said lower supply terminal and said second reference terminal, having its gate coupled to said upper supply terminal;

a third gating transistor coupled between said diode string and said first reference terminal, having its gate coupled to said upper supply terminal; and a fourth gating transistor coupled between said diode string and said second reference terminal, having its gate coupled to said upper supply terminal.

6. The driver of claim 5, wherein said power supply voltage is 3 V and the overload voltage is 5 V, and wherein said diode string comprises:

a first reducing transistor, said first reducing transistor being a PMOS transistor having its drain and backgate coupled to said output terminal, and having its source and gate coupled together;

a second reducing transistor, said second reducing transistor being a PMOS transistor having its drain and backgate coupled to the source of said first reducing transistor, and having its source and gate coupled together;

a third reducing transistor, said third reducing transistor being a NMOS transistor having its source and gate coupled to the source of said second reducing transistor, and having its backgate coupled to said lower supply terminal; and a fourth reducing transistor, said fourth reducing transistor being a NMOS transistor having its source and gate coupled to the drain of said third reducing transistor, and having its backgate coupled to said lower supply terminal.

7. The driver of claim 4 wherein said first upper protection circuit comprises:

a driver bypass circuit to turn off said upper driver transistor when said upper supply terminal is at said lower rail voltage and said overload voltage is present on said output terminal;

a driver backgate control circuit to provide a conductive path between said upper supply terminal and the coupled backgate of said upper driver transistor when said power supply voltage is present on said upper supply terminal, and remove the conductive path when said lower rail voltage is present on said upper supply terminal; and a driver backgate protection circuit to provide said buffer voltage to the drain of said upper driver transistor when said upper supply terminal is at said lower rail voltage and said overload voltage is present on said output terminal.

8. The driver of claim 7 wherein:

said driver bypass circuit comprises a PMOS driver bypass transistor coupled between the gate and drain of said upper driver transistor, having its gate coupled to said upper supply terminal;

said driver backgate control circuit comprises first and second regulating transistors being serially coupled in a non-inverting configuration between said lower supply terminal and the backgate of said upper driver transistor, and a third regulating transistor coupled in parallel with said first and second regulating transistors between said upper supply terminal and the backgate of said upper driver transistor; and said driver backgate protection circuit comprises a reducing circuit to couple said third reference terminal to the drain of said upper driver transistor.

9. The driver of claim 7 wherein said second upper protection circuit comprises:

a buffer bypass circuit to suppress the conduction of said upper buffering transistor when said overload voltage is present on said output terminal;

a buffer backgate control circuit to provide a conductive path between the backgate of said upper buffering transistor and said upper supply terminal when said power supply voltage is present on said upper supply terminal, and remove the conductive path when said lower rail voltage is present on said upper supply terminal; and a buffer backgate protection circuit to provide said overload voltage to the backgate of said buffering transistor when said overload voltage is present on said output terminal.

10. The driver of claim 9 wherein:

said buffer bypass circuit comprises a PMOS buffer bypass transistor coupled between the gate and drain of said upper buffering transistor, the gate of said PMOS buffer bypass transistor being coupled to said first reference terminal;

said buffer backgate control circuit comprises a PMOS control transistor and a NMOS control transistor connected in parallel between said output terminal and the gate of a third control transistor, the gates of said PMOS and NMOS control transistors being coupled to said first reference terminal, and said third control transistor being coupled between the backgate of said upper driver transistor and the backgate of said buffering transistor; and said buffer backgate protection circuit comprises a PMOS backgate bypass transistor coupled between said output terminal and the backgate of said buffering transistor, the gate of said PMOS backgate bypass transistor being coupled to said first reference terminal.

11. The driver of claim 4 wherein said logic protection circuit comprises:

a transmission gate comprising a first transmission transistor and a second transmission transistor connected in parallel between said upper control terminal and the gate of said upper driver transistor, the gate of said first transmission transistor being coupled to said upper supply terminal and the gate of said second transmission transistor being coupled to said second reference output terminal so that:

when said upper supply terminal is at said power supply voltage, said transmission gate allows full-range input signal switching; and when said upper supply terminal is at said lower rail voltage, conduction is blocked between the gate of said upper driver transistor and said upper control terminal; and a blocking transistor and a logic buffering transistor connected in series between said upper control terminal and the gate of said upper buffering transistor, said blocking transistor being connected between said upper control terminal and said logic buffer circuit and having its gate coupled to said upper supply terminal, and said logic buffering transistor having its gate coupled to said first reference terminal so that:

when said upper supply terminal is at said power supply voltage, a conductive path is provided between said upper control terminal and the gate of said upper buffering transistor; and when said upper supply terminal is at said lower rail voltage, said blocking transistor blocks conduction between the gate terminal of said upper buffering transistor and said upper control terminal while said logic buffering circuit reduces the voltage seen by said blocking transistor to prevent gate oxide breakdown.

* * * * *